(12) United States Patent
Kirsch et al.

(10) Patent No.: US 11,740,700 B2
(45) Date of Patent: Aug. 29, 2023

(54) OPERATING DEVICE FOR A VEHICLE

(71) Applicant: BEHR-HELLA THERMOCONTROL GMBH, Lippstadt (DE)

(72) Inventors: Stefan Kirsch, Lippstadt (DE); Pasi Kemppinen, Tampere (FI)

(73) Assignee: BEHR-HELLA THERMOCONTROL GMBH, Lippstadt (DE)

( * ) Notice: Subject to any disclaimer, the term of this patent is extended or adjusted under 35 U.S.C. 154(b) by 172 days.

(21) Appl. No.: 17/426,772

(22) PCT Filed: Jan. 30, 2020

(86) PCT No.: PCT/EP2020/052347
§ 371 (c)(1),
(2) Date: Jul. 29, 2021

(87) PCT Pub. No.: WO2020/157231
PCT Pub. Date: Aug. 6, 2020

(65) Prior Publication Data
US 2022/0100275 A1   Mar. 31, 2022

(30) Foreign Application Priority Data

Jan. 31, 2019 (DE) ..................... 10 2019 102 461.7

(51) Int. Cl.
*G06F 3/01*    (2006.01)
*B60K 37/06*   (2006.01)
*H03K 17/965*  (2006.01)

(52) U.S. Cl.
CPC ............. *G06F 3/016* (2013.01); *B60K 37/06* (2013.01); *H03K 17/965* (2013.01);
(Continued)

(58) Field of Classification Search
None
See application file for complete search history.

(56) References Cited

U.S. PATENT DOCUMENTS 9,710,091 B2*  7/2017  Miles ............... G06F 3/0412
9,799,279 B1* 10/2017  Evans, V .......... G09G 3/035
(Continued)

FOREIGN PATENT DOCUMENTS

DE  10 2015 008 573 A1   1/2017
WO     2018/046302 A1   3/2015
WO     2016/012277 A1   1/2016

OTHER PUBLICATIONS

International Search Report and Written Opinion issued in corresponding International Application No. PCT/EP2020/052347 dated May 20, 2020, with English translation.

*Primary Examiner* — Matthew Yeung
(74) *Attorney, Agent, or Firm* — BakerHostetler

(57) ABSTRACT

The operating unit for a vehicle comprises a housing with an operating element on the front side, wherein the operating element has a display with a display surface and a cover plate, which defines an operating surface of the operating element, and has at least one projection region projecting laterally over the display, and is elastically laterally moveably mounted on and/or in the housing. An actuator is arranged below the cover plate, said actuator having a drive and a control element driven by the drive. The operating unit is also provided with an elastic actuation arm which protrudes from the cover plate and which is mechanically acted upon by the control element of the actuator at a force application point of the actuation arm. The actuation arm has a displacement portion, reaching between the cover plate and the force application point, for laterally shifting the cover plate, and is extended from the displacement portion thereof beyond the force application point, as well as being provided with an extension portion, within which the actuation arm is elastically and mechanically fixed.

13 Claims, 10 Drawing Sheets

Figure 1:
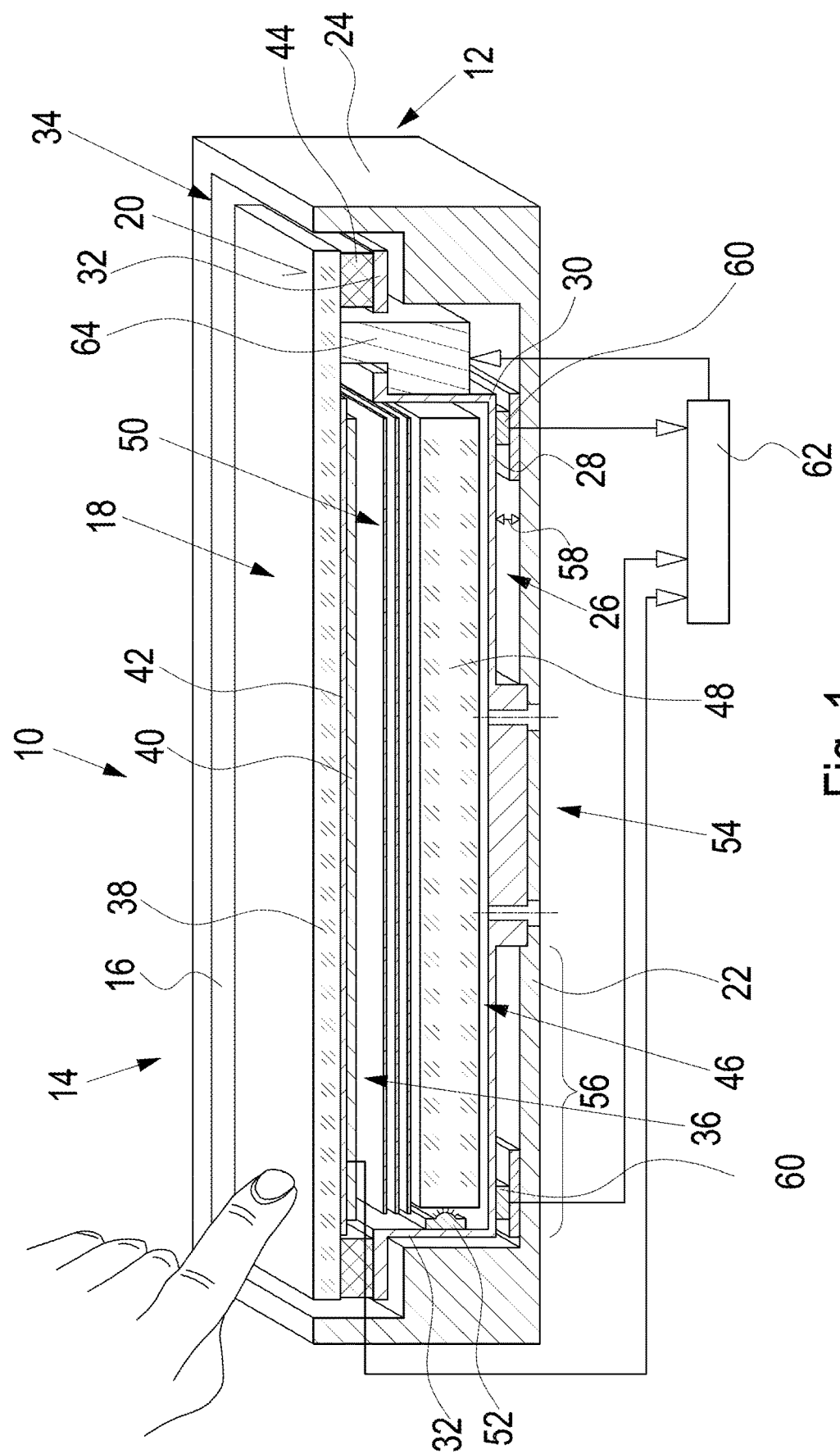

(52) U.S. Cl.
CPC ............ *B60K 2370/1438* (2019.05); *B60K 2370/158* (2019.05); *B60K 2370/693* (2019.05); *H03K 2217/96031* (2013.01); *H03K 2217/9651* (2013.01); *H03K 2217/96062* (2013.01)

(56) References Cited

U.S. PATENT DOCUMENTS

| | | | | |
|---|---|---|---|---|
| 10,013,058 | B2* | 7/2018 | Puskarich | H10N 30/206 |
| 10,645,834 | B2* | 5/2020 | Tossavainen | H04M 1/03 |
| 10,795,485 | B2* | 10/2020 | Ehrenberg | G06F 3/016 |
| 2008/0055277 | A1* | 3/2008 | Takenaka | G06F 3/016 |
| | | | | 345/177 |
| 2009/0002328 | A1* | 1/2009 | Ullrich | G09B 21/004 |
| | | | | 345/173 |
| 2009/0072662 | A1* | 3/2009 | Sadler | H10N 30/802 |
| | | | | 345/173 |
| 2009/0250267 | A1* | 10/2009 | Heubel | G06F 3/041 |
| | | | | 178/18.03 |
| 2011/0276878 | A1* | 11/2011 | Sormunen | G06F 3/03547 |
| | | | | 715/702 |
| 2014/0071079 | A1* | 3/2014 | Heubel | B06B 1/0629 |
| | | | | 345/173 |
| 2014/0098075 | A1* | 4/2014 | Kwak | G09G 3/2003 |
| | | | | 345/204 |
| 2014/0320431 | A1* | 10/2014 | Cruz-Hernandez | G06F 3/016 |
| | | | | 345/173 |
| 2014/0320436 | A1* | 10/2014 | Modarres | G06F 1/1652 |
| | | | | 345/173 |
| 2016/0313795 | A1* | 10/2016 | Muramatsu | G06F 3/041 |
| 2017/0068318 | A1* | 3/2017 | McClure | G06F 3/016 |
| 2017/0213488 | A1* | 7/2017 | Koo | G02F 1/133 |
| 2018/0011551 | A1* | 1/2018 | Gothlin | G06F 3/0346 |
| 2018/0275810 | A1* | 9/2018 | Khoshkava | G06F 3/0488 |
| 2019/0191582 | A1 | 6/2019 | Olien et al. | |
| 2019/0338561 | A1 | 11/2019 | Wachinger | |
| 2019/0391649 | A1* | 12/2019 | Heubel | G06F 3/041 |

* cited by examiner

OPERATING DEVICE FOR A VEHICLE

CROSS REFERENCE

This application is the U.S. National Phase under 35 U.S.C. § 371 of International Application No. PCT/EP2020/052347 filed on 30 Jan. 2020, which claims the benefit of German Application No. 10 2019 102 461.7 filed on 31 Jan. 2019, the entire contents of each are hereby incorporated by reference.

The invention relates to an operating device for a vehicle, for example for a vehicle component such as an air condition system, an infotainment system or a navigation system. Generally, the invention relates to a man-machine interface for a vehicle.

The use of displays in a vehicle, which are designed as touchscreens for the input of operating commands or the adjustment of parameters, enjoys increasing popularity. In order to signal a user that he has operated the touchscreen, systems with haptic feedback have proven their effectiveness. Here, the display or parts of the display, e.g., the cover plate, is mechanically excited in a pulse-like manner. The actuator required for this purpose is typically located beneath the mechanically excited display or beneath the mechanically excited part of the display. When the display or the relevant part of the display is excited in a pulse-like manner for a lateral displacement, the display or the corresponding part of the display undergoes a slight tilting movement if the effective direction, in which the actuator acts on the display or the corresponding part of the display, does not extend in the plane defined by the lateral displacement and the center of mass of the display or the relevant part of the display. Thus, the display experiences a torque that is disturbing because of a potential generation of noise, which torque may possibly be absorbed by a rather complex bearing. However, this comes with additional costs.

From US-A-2019/019582 an operating device with haptic feedback is known which uses a linear actuator designed as a flat microfiber composite laminate with integrated piezo elements.

It is an object of the invention to provide an operating unit for a vehicle with haptic feedback, in which the part of the operating unit that is mechanically excited for the tactile feedback substantially performs a translatory movement, in particular a translatory lateral movement.

To achieve this object, the invention provides a control unit for a vehicle, which is provided with
  a housing having a front side,
  an operating element on the front side of the housing,
  wherein the operating element comprises a display having a display surface and a cover plate, the cover plate defining an operating surface of the operating element and comprising at least one projecting portion laterally projecting beyond the display,
  wherein the cover plate is supported directly or indirectly on and/or in the housing in a manner allowing for elastic lateral displacement of the same,
  a sensory system for detection of a manual actuation of the operating element effected by a touch onto the operating surface with a presettable minimum pressing force,
  an actuator arranged below the cover plate and comprising a drive unit and an actuating element driven by the drive unit,
  wherein the drive unit of the actuator is rigidly coupled to the housing in a direct or indirect manner and is supported on it,
  an elastic actuation arm which projects from the projecting portion of the cover plate and which is mechanically acted on by the actuating element of the actuator at a force application point of the actuation arm, whereby the actuating element of the actuator and the actuation arm are mechanically coupled at the force application point,
  wherein the actuation arm comprises a displacement portion extending between the cover plate and the force application point, for lateral displacement of the cover plate, and
  wherein the actuation arm is extended, starting from its displacement portion, beyond the force application point and comprises an extension portion within which the actuation arm is elastically and mechanically fixed, and
  an evaluation and control unit which receives measuring signals from the sensory system and, upon detection of a valid actuation of the operating element, outputs to the drive unit of the actuator a control signal for pulsed mechanical excitation, e.g. a single pulse excitation, of the actuation arm by the actuating element of the actuator.

The operating unit according to the invention is provided with a housing, on the front side of which an operating element is arranged. The operating element is configured as a display and comprises a display surface as well as a cover plate that forms the operating surface of the operating element and has a projection portion projecting laterally beyond the display. The cover plate is mounted for elastic lateral movement. A sensor system detects whether the user has pressed the pressing surface with a predefinable minimum pressing force when touching the operating surface. If this is the case, which is determined by an evaluation and control unit connected to the sensor system, an actuator is driven which mechanically moves the cover plate to the side in a pulse-like manner. The mechanical coupling between the actuator and the cover pane occurs in the projection portion thereof, within which an elastic actuation arm is connected to the cover pane. The actuator acts on the actuation arm at a force application point, which comprises a displacement portion between the force application point and its connection to the cover plate for the lateral displacement of the cover plate. Thus, the actuator and the actuation arm are two components which are mechanically coupled, in particular connected, to one another at the force application point of the actuation arm.

According to the invention, the actuation arm is extended beyond the force application point and comprises an extension portion in this region which is fixed in the housing or outside the housing.

The concept of the invention for compensating a torque acting on the cover plate, which occurs because the actuator is spaced from the cover plate by the distance between the force application point of the actuation arm and its connection to the cover plate, is now compensated according to the invention by the fact that the actuation arm is extended, relative to the force application point, to the side opposite the cover plate and is fixed within this extension portion in the housing or outside the housing. Thereby, a torque acts in the extension portion of the actuation arm which counteracts the torque acting in the displacement portion of the actuation arm. Thus, there is substantially a torque compensation, which has an advantageous effect on the cover plate insofar as it is now displaced substantially translationally, i.e., laterally.

The actuation arm which, according to the invention, is elastic may be configured, according to one embodiment of the invention, as an (in particular flat) material strip preferably of metal and in particular of iron or steel, specifically spring steel. The actuation arm may also be formed from plastic material, wherein the shaping provides the material strip with the desired elasticity, e.g., by different material thicknesses.

Additional elasticity may be provided to the actuation arm within its extension portion by the fact that, according to a development of the invention feasible in this regard, the actuation arm has an arc portion of substantially 180 degrees in its extension portion, i.e., is substantially U-shaped in the extension portion, wherein the bent-back end of the extension portion is mechanically fixed at and/or in the housing.

In a further variant of the invention, it may be provided that the extension portion is fastened at its end in or to the housing with the interposition of an elastic, expandable material (e.g., an elastomer material such as rubber or silicone). In this embodiment of the actuation arm, the same may, for example, be angled in the extension portion about an axis extending parallel to the cover plate and directed orthogonally to the effective axis of the actuator, wherein the end of the angled end portion of the extension portion is fastened to or in the housing with the interposition of an elastic, in particular elastically shearing, connecting element.

In a further feasible embodiment of the invention, it may be provided that the extension portion comprises two partial portions that are elastically connected to one another, wherein the first partial portion extends from the force application point of the actuation arm and the second partial portion is connected to the first partial portion at the end thereof opposite the force application point of the actuation arm.

According to a first variant, these two partial portions may be connected integrally by an arcuate portion which runs in a curved manner about an imaginary axis which runs parallel to the cover plate and transversely to the effective axis of the actuator. The curved portion provides additional elasticity to the extension portion of the actuator arm, which compensates for the torque acting between the force application point and the cover plate. However, the two partial portions may also be connected to each other with the interposition of an elastic element (sandwich). Here, the elastic material of the element, which is in particular expandable and/or compressible, provides the additional flexibility of the actuation arm in the extension portion thereof.

An electromechanical or electro-magnetic drive is particularly suitable as an actuator. However, according to a further development of the invention, a piezo actuator with or without amplification gear is also particularly suitable as a drive, wherein, in the absence of amplification gear, the piezo actuator forms both the drive and the actuation element of the actuator, while in the presence of an amplification gear for the piezo actuator, the piezo actuator represents the drive and the amplification gear is the actuation element of the actuator.

The operating device according to the invention may suitably be combined with a simplified structure for the metrological detection of the minimum pressing force. This will be explained hereinafter.

It is advantageous in this respect to provide an operating device for a vehicle with a simplified structure for measuring the triggering force during manual actuation of the display.

According to one embodiment of the invention, this is achieved in a operating device which is provided with a housing with a front side having a receiving opening delimited by an opening edge, and with a rear wall, an operating element which is arranged in the receiving opening at a distance from the opening edge thereof and has an operating surface, said operating element having a front side provided with the operating surface, a rear side and a boundary edge region, a holding element with a base wall and support pieces projecting from the same, which end below the boundary edge region of the operating element and are mechanically coupled with the same in its boundary edge region, wherein the bottom wall of the holding element comprises a central region spaced from the supporting parts, within which the bottom wall of the holding element is supported at the rear wall of the housing, a plurality of actuation sensors detecting a manual actuation of the operating element, said sensors being arranged within the surrounding area surrounding the central area of the bottom wall of the holding element and being spaced from the rear wall of the housing between the bottom wall of the holding element and the rear wall of the housing, and an evaluation unit receiving signals from the actuation sensors and evaluating these for detecting a manual actuation of the operating element with a presettable minimum pressing force.

With this variant of the invention, it is proposed analogously to use the holding element, which supports the operating element, for transmitting the pressing force to corresponding actuation sensors which sense the pressing force with which the operating surface of the operating element is actuated.

The holding element is substantially configured as a trough-shaped element with a base wall from which support pieces protrude at preferably all edge portions. In particular, the bottom wall comprises a circumferential upright peripheral wall which feasibly merges into a likewise circumferential flange. In this embodiment of the invention, the support pieces are formed as those side wall portions that project from the base wall along each edge portion thereof. However, it is also conceivable that individual support pieces, which are separated from one another and thus spaced apart, project from the bottom wall at preferably all edge portions.

The support pieces are coupled to the operating element in a boundary edge region thereof. The operating element itself has a front side forming the operating surface, a rear side and the above-mentioned circumferential boundary edge region.

The holding element itself is situated in the housing of the operating device, which has a front side with a receiving opening defined by an opening edge, within which the operating element is arranged. The housing further has a rear wall. Finally, the housing also comprises side walls.

A characteristic of the operating device according to the invention is that the holding element is rigidly connected to the rear wall of the housing in a central region of its base wall. Thus, the rear wall supports the holding element in this central region of the base wall. Outside the central region, i.e., in the region surrounding the central region of the base wall, the holding element is at a distance from the rear wall of the housing; an annular gap is formed between the holding element and the rear wall.

If the operating surface of the operating element is manually actuated, the holding element, and in particular its bottom wall, undergoes a bending moment. This is due to the fact that the force with which the operating surface of the operating element is manually pressed is transmitted to the base wall via the boundary edge region of the operating element and the support pieces mechanically coupled to this boundary edge region. Since the base wall is mounted centrally and otherwise has a gap towards the rear wall of the housing, the base wall may be deformed in the manner of a bending beam clamped on one side or may absorb corresponding bending moments. These are transmitted to actuation sensors situated between the surrounding region around the central region of the bottom wall and the rear wall of the housing. The actuation sensors may be configured as displacement sensors and/or force sensors and/or pressure sensors. MEMS components (micro-electronic mechanical sensors) are particularly useful. The measurement signals from the actuation sensors are sent to an evaluation unit which, among other things, comprises a microprocessor with a corresponding hardware environment. In the evaluation unit, the measurement signals of the actuation sensors are evaluated for detecting a valid manual actuation, i.e. an actuation of the operating element with a presettable minimum pressing force. Thus, erroneous operations of the operating element can be excluded.

The operating device according to this development of the invention is characterized by a compact design. The shear-resistant connection of the holding element to the rear wall of the housing allows to provide an actuator between the holding element and the operating element for giving a possibly desired haptic feedback of the operating device. In this case, the actuator would on the one hand be supported on the holding element so as to mechanically excite the operating element in a pulse-like manner, for example for a lateral pulse-like movement of the operating element, which can be detected manually in a tactile manner and thus gives tactile feedback of a valid actuation of the operating element.

In a further advantageous embodiment it is provided that the evaluation unit also evaluates the signals of the actuation sensors for detecting the position on the operating surface of the operating element at which the manual actuation of the operating element occurs.

As an alternative or in addition, the operating element may be provided with a touch sensor system for detecting the position on the operating surface of the operating element at which manual actuation of the operating element occurs. The touch sensor system may be capacitive, resistive or optical. If MEMS are used, the bending moment to which the bottom wall of the holding element is subjected during manual actuation of the operating surface of the operating element may be transmitted to bending beams, bending membranes or the like, with the mechanical bending of these micromechanical elements of the MEMS being detected by transistor or resistance measuring pressures or other micromechanical, microelectrical components.

In a further suitable embodiment, the support pieces and the boundary edge region of the actuation element may be connected rigidly.

As mentioned already above, the operating device according to the invention may also be provided with a haptic feedback functionality. Here, the general procedure is to mechanically excite the operating surface when a valid actuation has been detected. To this end, the operating element with the holding element would have to be connected electrically. According to the concept of a shear-resistant connection of the holding element to the rear wall of the housing, as presented in the context of the present invention, the operating element remains for a mechanical excitation for the haptic feedback functionality, which operating element has to be connected to the support pieces of the holding element in an elastic and thus resilient manner for this purpose. Insofar, a variant of the invention suggests that the support pieces and the boundary edge region of the operating element are mechanically coupled with each other via a resilient connection element arranged between them.

It is particularly advantageous, if the connection element is resilient after compression in a direction vertical to the operating surface of the operating element and is resiliently shearable when the operation element is displaced orthogonally thereto. A suitable material for the connection element is elastomer material such as rubber or silicone. The connecting element is feasibly configured as a strip material which preferably extends along the entire boundary edge region and mechanically couples the same to the support pieces of the holding element. The geometric shape of the strip material allows its elasticity perpendicular and transverse to the operating surface to be influenced within certain limits. It is also possible to use composite material, i.e., elastomeric material and rigid bodies embedded therein, which substantially reduce or completely eliminate the compressibility perpendicular to the operating surface, but nevertheless still ensure the transverse shearability of the connection element.

With the previously described concept of the elastic connection of the operating element to the holding element, it is possible to arrange an actuator for the haptic feedback between the holding element and the operating element, which is supported on the holding element (and thus on the housing via the latter) and mechanically excites the operating element with its actuator. A suitable actuator is an electromechanical actuator such as a tie rod, for example, or also a piezo actuator (with or without amplification gear).

In a further advantageous embodiment, it may be provided that the operating element comprises a display with a front side displaying information, which front side forms the operating surface of the operating element. Here, the display may comprise a cover plate defining the operating surface with a display unit arranged behind the same for the optical display of information. In such a configuration of the operating element with a display, the cover plate suitably protrudes beyond the display unit on all sides, this projection region forming the boundary edge region of the operating element.

The displays mainly used today in operating devices operate with LCD technology. For a better visualization of the displayed information, such displays are provided with backlight units. The holding element supporting the operating element in the operating device according to the invention, may be used feasibly to receive such a backlight unit. As an alternative, however, displays are also used in which the individual pixels light up automatically, so to speak, when they are needed to display information. Different from LCD technology, the display is not configured as a type of shutter, but is equipped with individual pixels that can be actively controlled for illumination. An example of such a display is an OLED display. With displays that can be actively controlled to illuminate individual pixels, a backlight unit is no longer necessary. With such displays, the holding element fulfills the function of a mechanical protection means for the rear of the display, which the holding element also performs if the display has a backlight unit received by the holding element. In both cases, the holding element more or less covers the rear of the display.

The concept presented above, according to which the holding element is used to transmit the moments acting on the operating element upon manual actuation, is the same in all of these cases.

Figure 2:
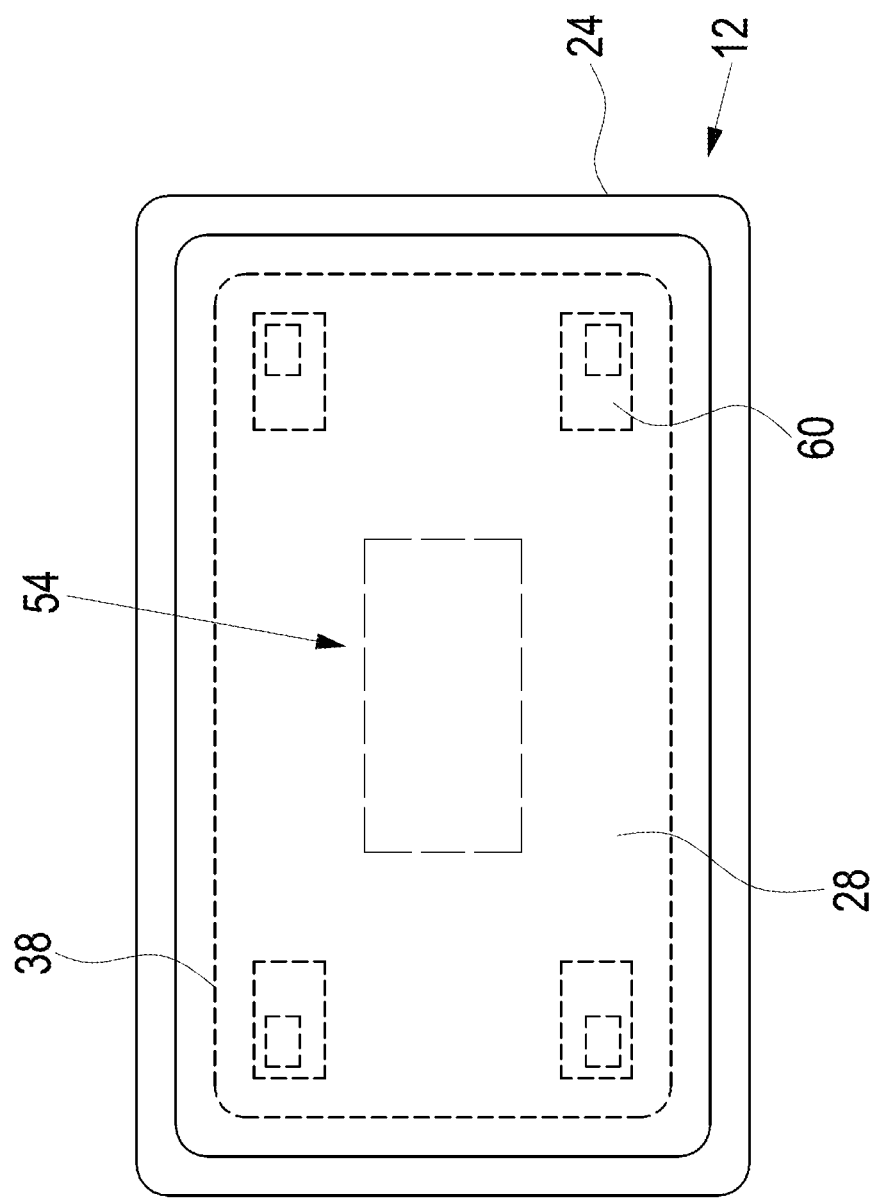
Figure 3:
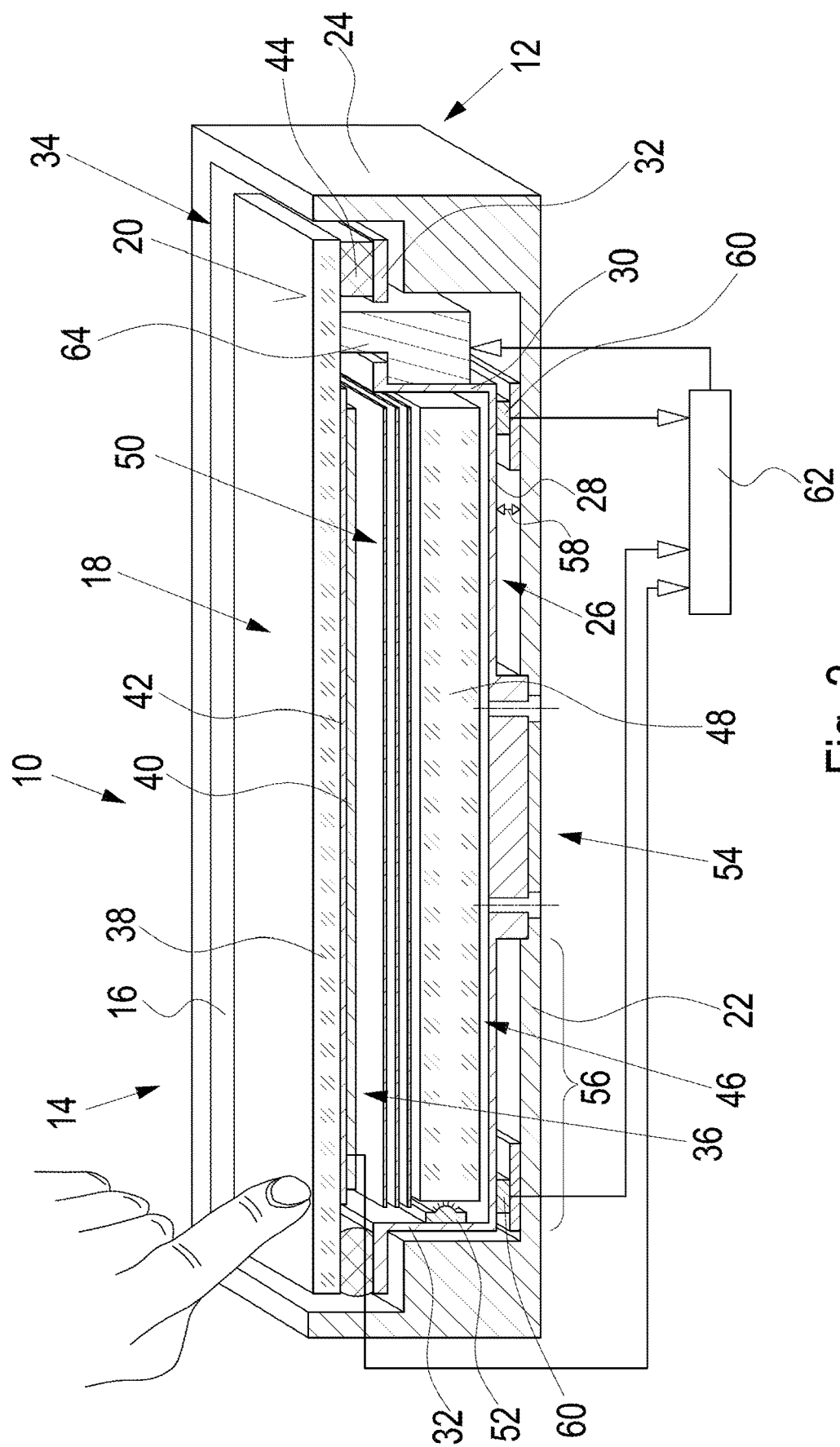
Figure 4:
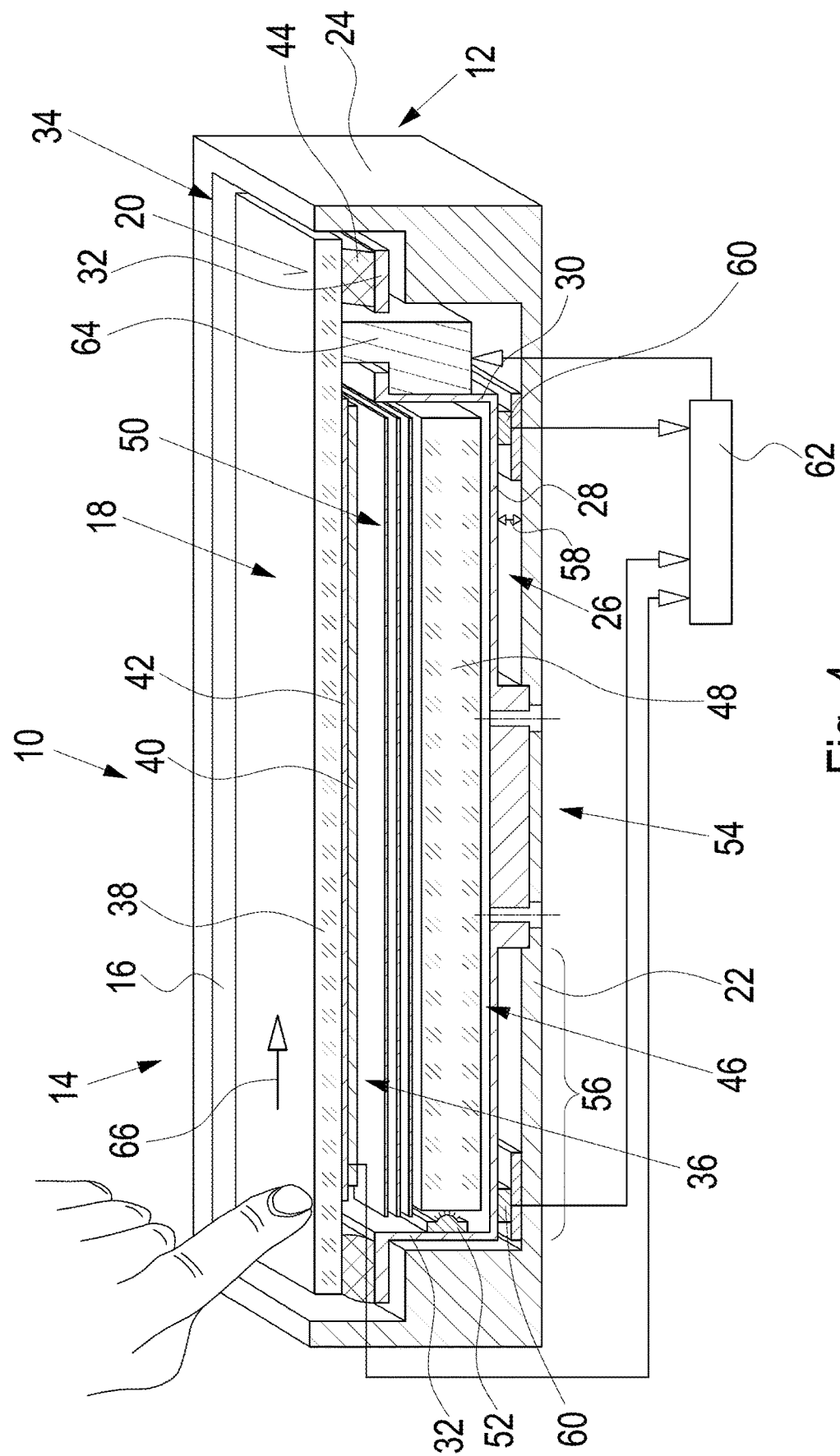

The invention will be discussed hereinafter in more detail with reference to embodiments and to the drawing. In the Figures:

FIG. 1 is a portional view of the structure of an operating device in which the invention can be realized, FIG. 2 is a top plan view on the operating device, FIG. 3 shows a situation in which pressure is exerted with one finger of a hand on the operating surface of the operating element of the operating device, and FIG. 4 shows a situation in which, due to a valid actuation of the operating surface of the operating element, the same is mechanically excited laterally in a pulse-like manner.

Figure 5:
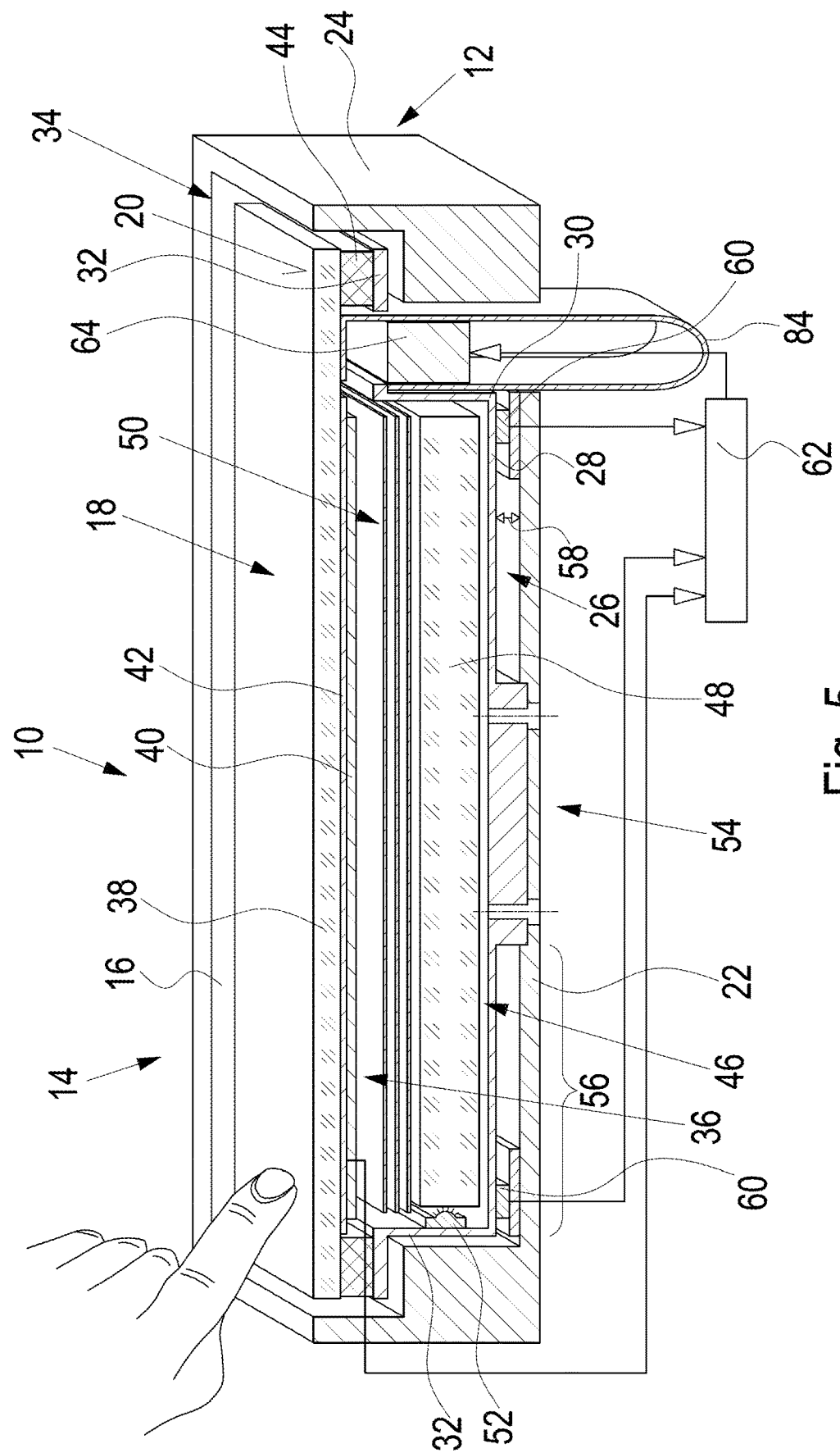
Figure 6:
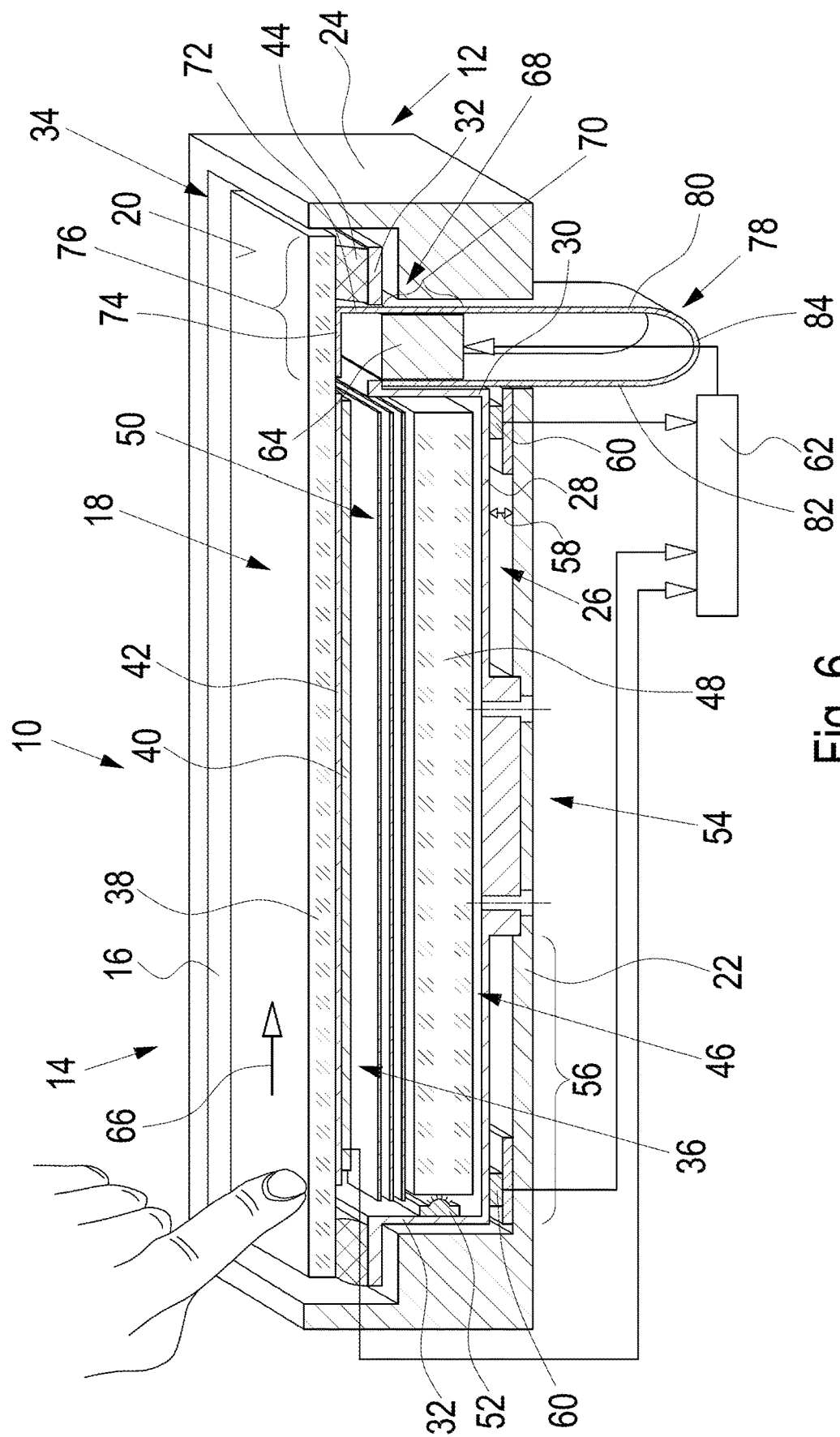
Figure 7:
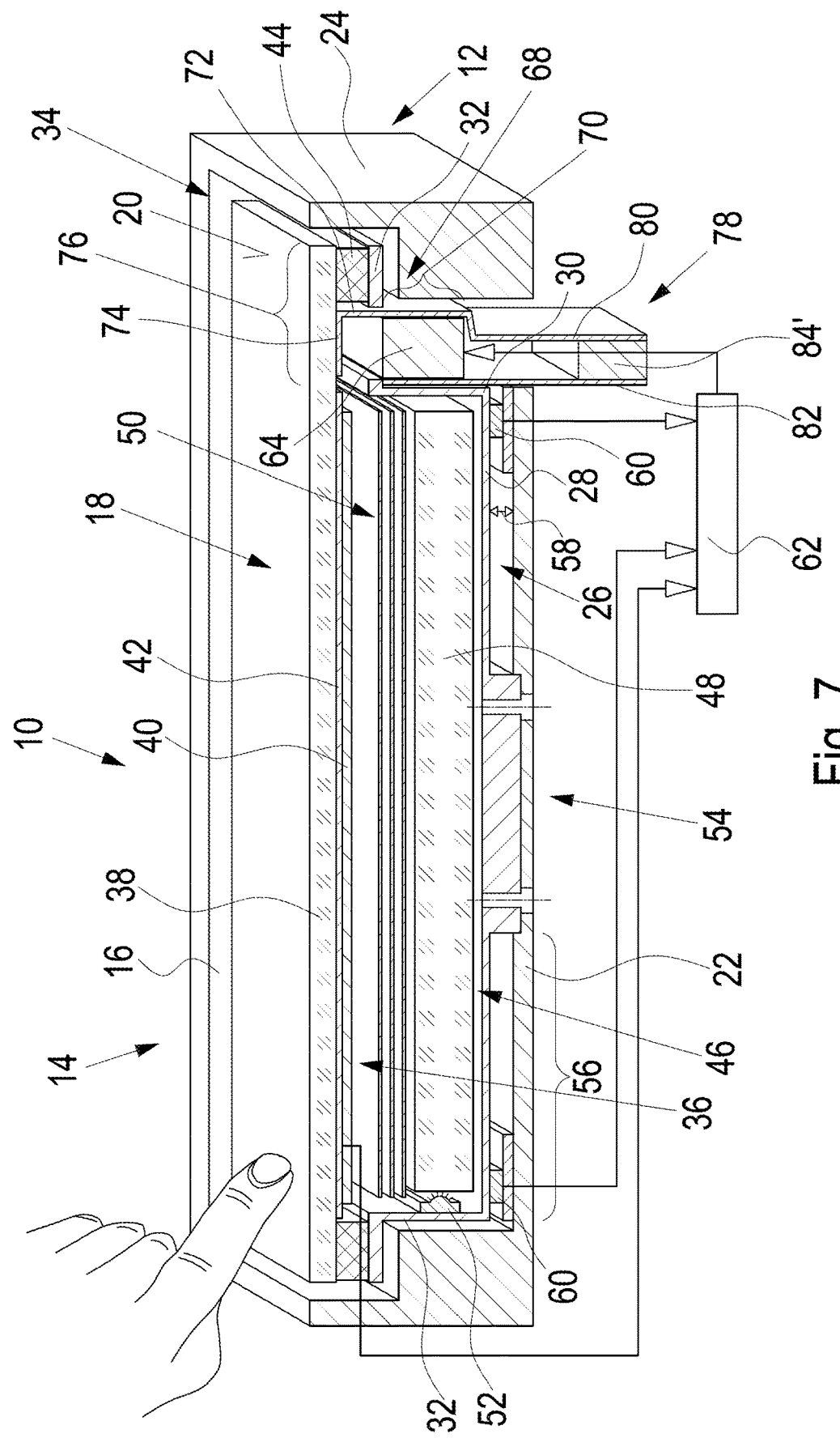
Figure 8:
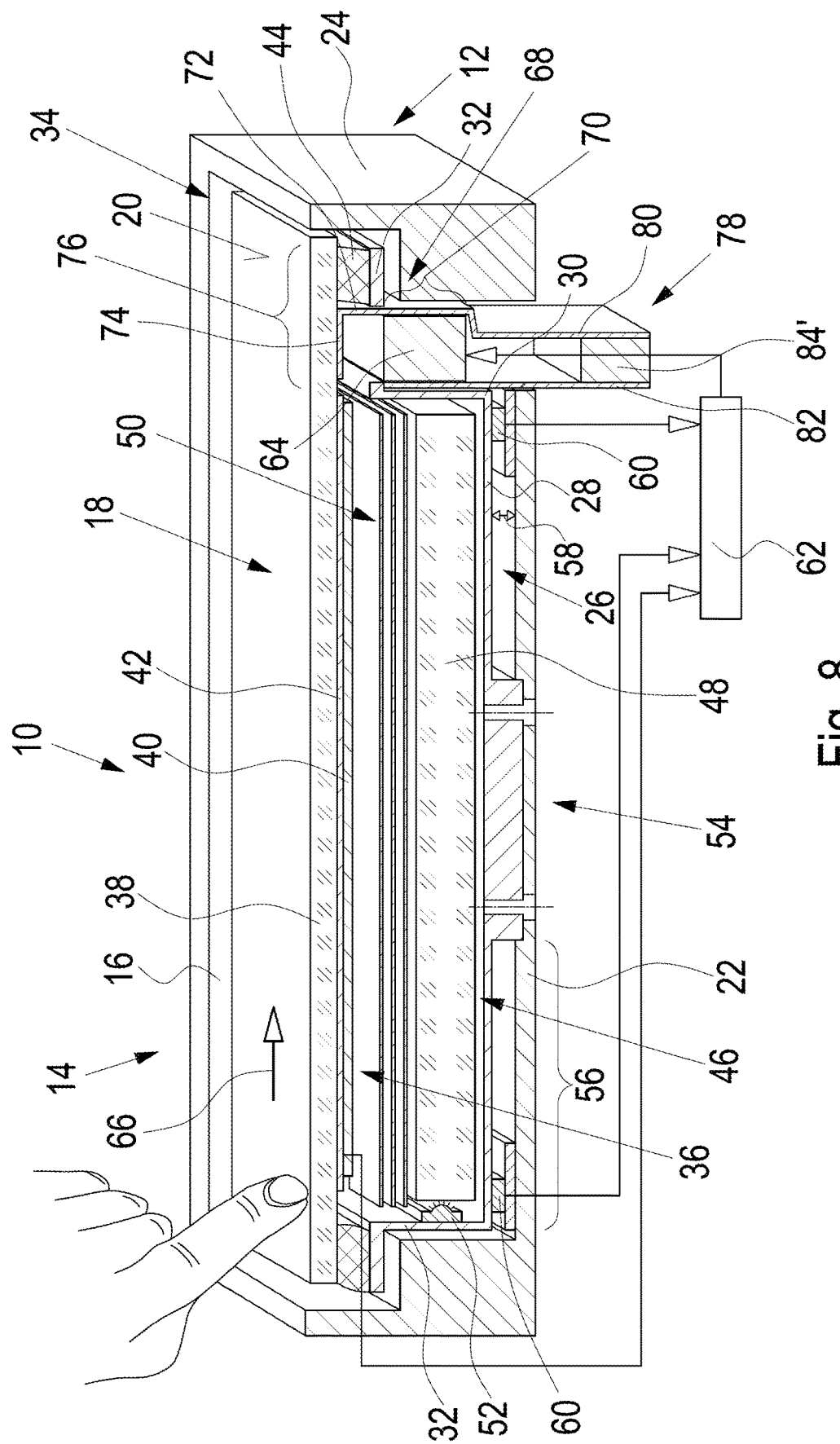
Figure 9:
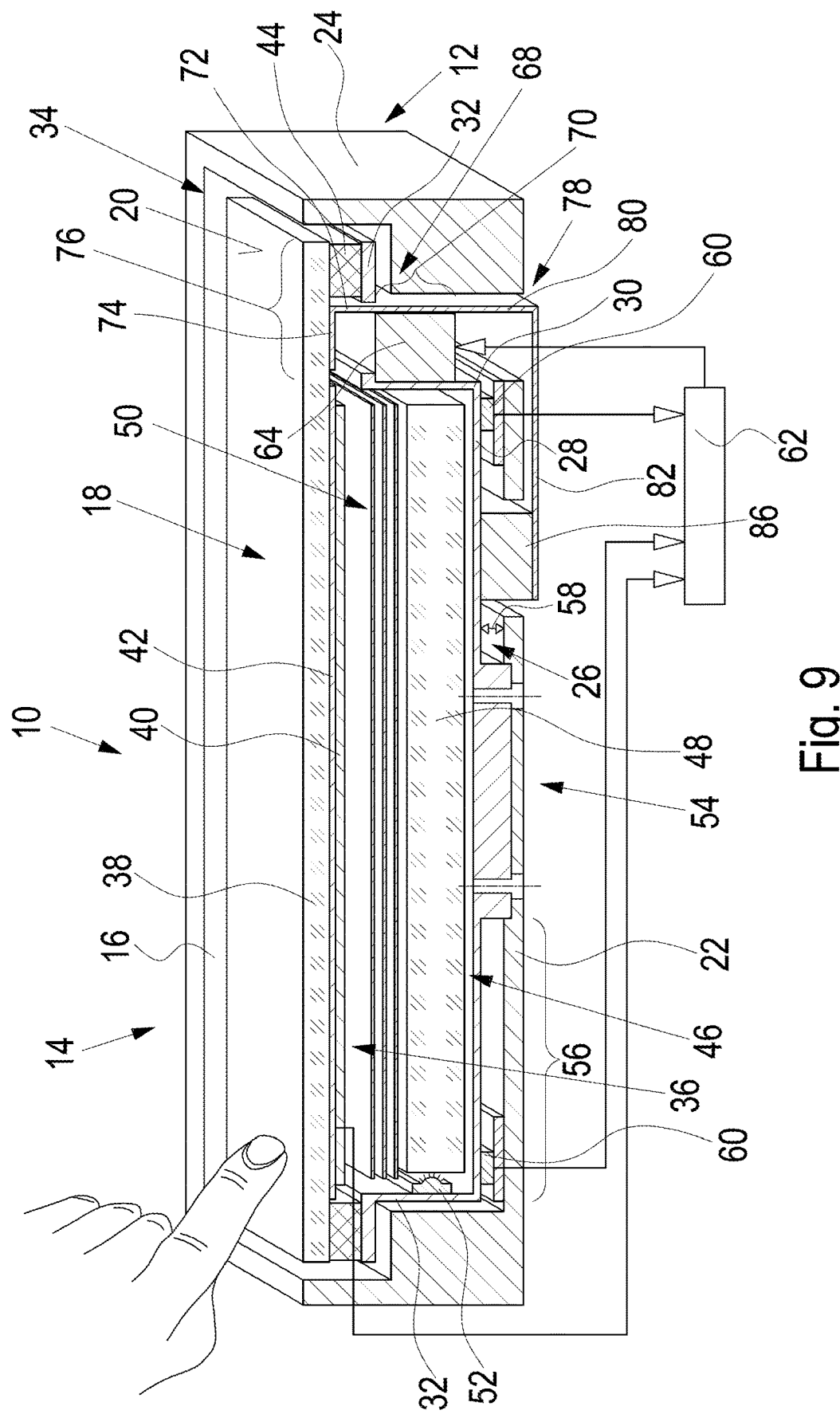
Figure 10:
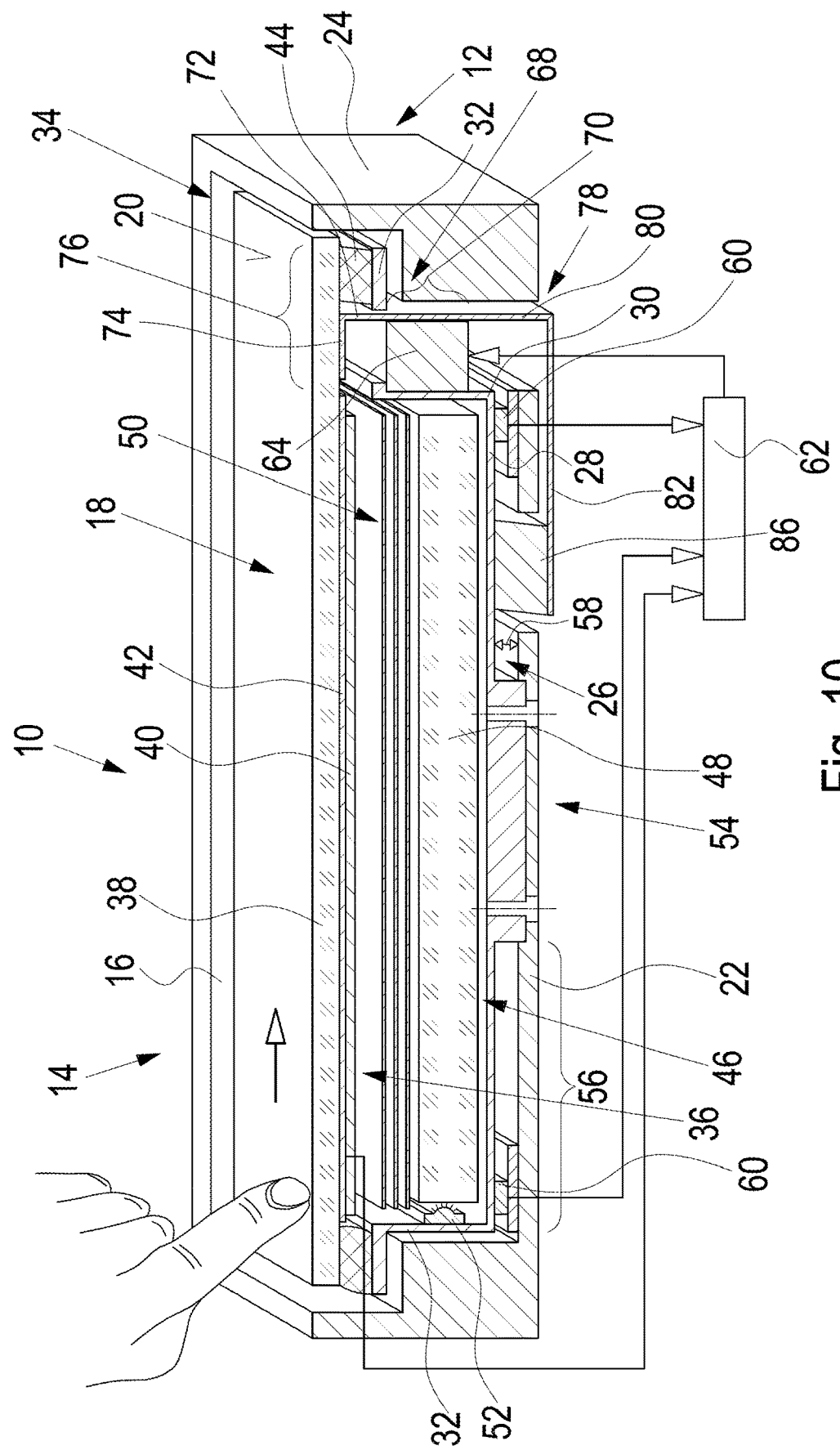

FIG. 5 shows a first embodiment of the operating device of FIGS. 1 to 4 configured according to the invention, the operating device being illustrated in a state not yet excited laterally, FIG. 6 shows the operating device of FIG. 5 when the cover plate is excited laterally to generate a haptic feedback, FIG. 7 shows a second embodiment of the operating device of FIGS. 1 to 4 configured according to the invention, the operating device being illustrated in a state not yet excited laterally, FIG. 8 shows the operating device of FIG. 7 when the cover plate is excited laterally to generate a haptic feedback, FIG. 9 shows a third embodiment of the operating device of FIGS. 1 to 4 configured according to the invention, the operating device being illustrated in a state not yet excited laterally, and FIG. 10 shows the operating device of FIG. 9 when the cover plate is excited laterally to generate a haptic feedback.

FIG. 1 schematically illustrates the basic structure of an operating device 10 according to an embodiment of the invention. The operating device 10 comprises a housing 12 with a receiving opening 16 in its front side 14, in which an operating element 18 with an operating surface 20 is arranged. The housing further comprises a rear wall 22 connected to the front side 14 of the housing 12 via side walls 24.

A holding element 26, which in this embodiment is trough-shaped, is provided in the housing 12, the element having a bottom wall 28 from which upright support pieces 30 protrude on all sides of the bottom wall 28 and merge into an outwardly directed mounting flange 32. The mounting flange 32 is mechanically coupled to the peripheral boundary edge region 34 of the operating element 18.

In this embodiment, the operating element 18 is configured as a display 36. The display 36 comprises a cover plate 38, the front side of which forms the operating surface 20 of the operating element 18. The display unit 40 (for example implemented in LCD technology) is located behind the cover plate 38. Further, the display 36 can also comprise a touch sensor in the form of a touch panel 42. Such displays are known per se in prior art and will not be described further herein.

In the boundary edge 34 of the cover plate 38, the same is connected to the mounting flange 32 in a resilient manner. This is achieved by a connecting element 44, which in this embodiment is configured as an elastomeric strip extending along the mounting flange 32. The connecting element is glued, for example, to the mounting flange 32 and to the cover plate 38 in a shear-resistant manner.

A backlighting unit 46 for backlighting the display 36 is situated in the trough-shaped mounting element 26, which unit comprises a light guide element 48 and a diffuser 50 for homogenizing the light emitted by the light guide element 48 towards the display 36. In this embodiment, light is supplied into the light guide element 48 via LEDs arranged on the inside of the support pieces as light sources 52. Again, this technology is known per se and will not be explained further herein.

A characteristic of the operating device 10 according to FIG. 1 can be seen in the rigid connection of the holding element 26 to the rear wall 22 of the housing 12. This is illustrated in FIG. 1. Here, a center region 54 of the bottom wall 28 is connected to the rear wall 22 of the housing 12. The surrounding region 56 of the bottom wall 28, which extends on all sides around the center area 54, is arranged spaced from the rear wall 22 of the housing 12 (see the gap space 58). In this gap, actuation sensors 60 are preferably situated in the corner regions of the bottom wall 28, as indicated in FIG. 2.

The actuation sensors 60 transmit their measurement signals to an evaluation unit 62, which, in addition, receives information from the touch sensors (touch panel 42) of the display 36. The signals from the actuation sensors 60 are analyzed in the evaluation unit 62 so as to decide whether the user interface 20 has been pressed with a minimum pressing force during manual actuation, which is decisive for a valid actuation of the operating surface 20.

The operating device 10 is further provided with a haptic feedback functionality. To this end, the operating device 10 comprises an actuator 64 configured, for example, as an electromagnetic actuator or a piezo actuator. The task of this actuator 64 is to mechanically excite the control element 18 laterally in a pulse-like manner upon detection of a valid actuation of the control element. Among other things, the elastic connecting element 44 serves this purpose, which element on the one hand, permits the transmission of force or moment from the operating element 18 to the actuation sensors 60 via the holding element 26 and, on the other hand, however, also permits a laterally acting shear effect.

This is illustrated in FIGS. 3 and 4. FIG. 3 shows the situation in the moment of a manual contact of the operating surface 20 with a minimum pressing force required for a valid actuation. The actuation sensors 60 sense a pressuring force. If the same is greater than the minimum pressing force, the evaluation unit 62 outputs a control signal to the actuator 64, which excites the operating element 18 mechanically in a pulse-like manner, as indicated by the arrow 66 in FIG. 4.

FIG. 3 illustrates that when decentralized manual pressure is applied to the control surface 20, the actuation sensors 60 opposite the point of contact on the control surface 20 (i.e., the or both touch sensors 60 on the right in FIG. 3) are still in contact with the holding element 26. With pressure or force sensors as actuation sensors 60, this may be useful. When displacement sensors are used as actuation sensors 60, a distance may form between these sensors and the holding element 26 (when the sensors are arranged on the rear wall 22 of the housing 12) or between these sensors and the rear wall 22 (when these sensors are arranged on the lower side of the holding element 26) or may be present when the operating element 18 is in a rest state.

In addition to detecting whether the presettable minimum pressing force has been applied when the operating surface 20 is touched, the actuation sensors 60 can also be used to determine the location at which the operating element 18 has been acted upon manually. Depending on the location at which the control surface 20 is acted upon, the force with which the control surface 20 is manually pressed has the effect of providing measurement signals of different magnitude from the plurality of actuation sensors 60. By a corresponding prior calibration, the location of manual actuation of the operating surface 20 can then be concluded depending on the measurement signal pattern.

FIGS. 5 and 6 illustrate a first embodiment according to which the operating unit 10 of FIGS. 1 to 4 is supplemented according to the invention so as to compensate for rotational or tilting moments acting on the cover plate 38, which occur when the cover plate 38 is laterally excited in a pulse-like manner. To this end, an actuation arm 68 is located between the actuator 64 and the cover plate 38, which has a force application point or force application region indicated at 70, in which or within which the actuator 64 acts on the actuation arm 68 to displace the same laterally. The actuator 64 is a piezo actuator or an electromechanically or electromagnetically acting actuator.

The actuation arm 68 comprises a displacement portion 72 between the force application point 70 and the cover plate 38, which portion is fixedly connected at its end 74 to the cover plate 38, i.e. on its lower side within a projection region 76 of the cover plate 38.

With respect to the force application point or the force application region 70, the actuation arm 68 extends to the side opposite the displacement portion 72 within an extension portion 78. This extension portion 78 comprises a first partial portion 80 that extends from the force application point or the force application region 70 and a second partial portion 82 contiguous with the first partial portion 80 and is fixed in the housing 12, i.e., in this embodiment to the holding element 26, for example to one of the support pieces 30 of the holding element 26. The actuator 64 is also supported directly or indirectly on the holding element 26 or on said supporting part 30 of the holding element.

Essential to the advantageous lateral movement of the cover plate 38 according to the invention, which is substantially free of rotational or tilting moments, is the elastic configuration of the actuation arm 68 in its region opposite the cover plate 38 relative to the force application point 70, i.e., in the region of the extension portion 78. In the embodiment in FIGS. 5 and 6 this is achieved by an elastic connection of the two partial portions 80, 82 via an arcuate portion 84. Preferably, the material from which the actuation arm 68 is made is also flexible and resilient. For example, it may be spring steel or the like.

The operation of the torque compensation is as follows. By extending the actuation arm 68 (beginning at the cover disc 38, beyond the force application point 70 and into the extension portion 78), a torque is also exerted on the actuation arm 68 in the extension portion 78, which results in the compensation of a rotational or tilting movement of the cover plate 38 during lateral movement. Instead of the presence of the arcuate portion 84, the extension portion 78 of the actuation arm 68 could be fastened to the housing or outside the housing 12 of the operating unit 10 at the end of the first partial portion 78.

FIGS. 7 and 8 illustrate a second embodiment of the operating unit 10 according to the invention. The difference to the embodiment in FIGS. 5 and 6 consists in the configuration of the actuation arm 68. Insofar as the elements of this actuation arm 68 are structurally or functionally similar to those of the actuation arm 68 of the embodiment in FIGS. 5 and 6, they are identified by the same reference numerals in FIGS. 7 and 8 as in FIGS. 5 and 6.

The difference in the construction of the actuation arm 68 in FIGS. 7 and 8 compared to FIGS. 5 and 6 is that the two portions 80 and 82 are no longer connected by an arcuate portion, but by an elastic expandable connecting element 84'. The elastic connecting element 84' is, e.g., an elastomeric material, so that the extension portion 78 is in turn provided with elasticity or additional elasticity which causes torque compensation, as described above.

FIGS. 9 and 10 illustrate a third embodiment of an operating unit 10 according to the invention. Again, this embodiment differs from those in FIGS. 5 to 8 by the design of the actuation arm 68. Elements which are structurally identical or functionally identical with the actuation arm 68 of the embodiments in FIGS. 5 to 8 are identified in FIGS. 9 and 10 by the same reference numerals as in the above-mentioned Figures.

Different from the embodiments of the actuation arms 68 in FIGS. 5 to 8, the actuation arm 68 in FIGS. 9 and 10 is provided, in this embodiment, with a right-angled extension portion 78. Thus, the second portion 82 is oriented at right angles to the first portion 80, and is fastened at its end to the lower side of the bottom wall 28 of the holding element 26 by an elastic connecting element 86. This elastic connecting element 86, which shears when the actuation arm 68 is displaced laterally, again provides elasticity to the extension portion 78, which causes torque compensation at the cover plate 38.

Individual embodiments of the invention may comprise one or more features listed below:

1. Operating device for a vehicle, with
    a housing 12 with a front side 14 comprising a receiving opening 16 defined by an opening edge, and comprising a rear wall 22,
    an operating element 18 which is arranged in the receiving opening 16 at a distance from the opening edge thereof, comprises an operating surface 20 and a front side provided with the operating surface 20, a rear side and a boundary edge region 34,
    a holding element 26 comprising a bottom wall 28 and support pieces 30 projecting therefrom, which end below the boundary edge region 34 of the operating element 18 and are mechanically coupled to the latter in its boundary edge region 34,
    wherein the bottom wall 28 of the holding element 26 comprises a central region spaced from the support pieces 30, within which the bottom wall 28 of the holding element 26 is supported at the rear wall of the housing 12,
    a plurality of actuation sensors 60 detecting a manual actuation of the operating element 18 and being arranged within the surrounding region between the base wall 28 of the holding element 26 and the rear wall of the housing 12, said surrounding region surrounding the central region of the bottom wall 28 of the holding element 26 and being spaced from the rear wall of the housing 12, and
    an evaluation unit 62 receiving signals from the actuation sensors 60 and evaluating the same for the purpose of detecting manual actuation of the operating element 18 with a presettable minimum pressing force.

2. Operating device according to point 1, wherein the evaluation unit 62 further evaluates the signals from the actuation sensors 60 for the purpose of determining the position on the operating surface 20 of the operating element 18 at which the manual actuation of the operating element 18 occurs.

3. Operating device according to item 1, wherein the operating element 18 is provided with a touch sensor system for the detection of the position on the operating surface 20 of the operating element 18 at which the manual actuation of the operating element 18 occurs.

4. Operating device according to point 3, wherein the touch sensor system operates capacitively, resistively or optically.
5. Operating device according to any one of points 1 to 4, wherein the support pieces 30 and the boundary edge region 34 of the operating element 18 are rigidly connected.
6. Operating device according to one of points 1 to 4, wherein the support pieces 30 and the boundary edge region 34 of the operating element 18 are mechanically coupled by means of a resilient connecting element 44 arranged therebetween.
7. Operating device according to point 6, wherein the connecting element 44 is resilient after a compression occurring perpendicularly to the operating surface 20 of the operating element 18 and is capable of being sheared resiliently in case of a displacement of the operating element occurring orthogonally thereto.
8. Operating device according to any one of points 1 to 7, wherein the operating element 28 comprises a display 36 with a front side for displaying information, which forms the operating surface 20 of the operating element 18.
9. Operating device according to point 8, wherein the display 36 comprises a cover plate 38 defining the operating surface 20 with a display unit 40 arranged behind the same for the optical display of information.
10. Operating device according to point 9, wherein the cover plate 38 protrudes beyond the display unit 40 on all sides and the projection portion forms the boundary edge region 34 of the operating element 18.
11. Operating device according to point 10, wherein the holding element accommodates a backlighting unit 46 for backlighting the display unit 40.
12. Operating device according to point 6 or according to point 6 and one of the previous points, if referred back to point 6, comprising an actuator which can be controlled by the evaluation unit 62 to generate a tactile feedback upon an actuation of the operating element 18 performed with the predetermined minimum pressing force by mechanical action on the operating element 18.
13. Operating device according to any one of points 1 to 12, wherein the actuation sensors 60 comprise displacement and/or force and/or pressure sensors.

LIST OF REFERENCE NUMERALS

10 operating device
12 housing
14 front side of the housing
16 receiving opening in the front side
18 operating element
20 operating surface of the housing
22 rear wall of the housing
24 side walls of the housing
26 holding element
28 bottom wall of the holding element
30 support pieces of the holding element
32 mounting flange of the support pieces
34 boundary edge region of the operating element
36 display
38 cover plate of the display
40 display unit of the display
42 touch panel of the display
44 connecting element
46 backlight unit of the display
48 light guide element of the backlight unit
50 diffuser of the backlight unit
52 light sources of the backlight unit
54 center region of the bottom wall
56 surrounding region around the center area
60 actuation sensors
62 evaluation unit
64 actuator
66 arrow
68 actuation arm
70 force application point
72 displacement portion of the actuation arm
74 end of the displacement portion of the actuation arm
76 projection portion of the cover plate of the display
78 extension portion of the actuation arm
80 first partial portion of the extension portion of the actuation arm
82 second partial portion of the extension portion of the actuation arm
84 elastic connecting element
84' elastic connecting element
86 elastic connecting element

The invention claimed is:

1. Operating unit for a vehicle, comprising
a housing having a front side,
an operating element on the front side of the housing,
wherein the operating element comprises a display having a display surface and a cover plate, the cover plate defining an operating surface of the operating element and comprising at least one projecting portion laterally projecting beyond the display,
wherein the cover plate is supported on and/or in the housing in a manner allowing for elastic lateral displacement of it,
a sensory system for detection of a manual actuation of the operating element effected by a touch onto the operating surface with a presettable minimum pressing force,
an actuator arranged below the cover plate and comprising a drive unit and an actuating element driven by the drive unit,
wherein the drive unit of the actuator is rigidly coupled to the housing in a direct or indirect manner and is supported on it,
an elastic actuation arm which projects from the projecting portion of the cover plate and which is mechanically acted on by the actuating element of the actuator at a force application point of the actuation arm,
wherein the actuation arm comprises a displacement portion extending between the cover plate and the force application point, for lateral displacement of the cover plate, and
wherein the actuation arm is extended, starting from its displacement portion, beyond the force application point and comprises an extension portion within which the actuation arm is elastically and mechanically fixed, and
an evaluation and control unit which receives measuring signals from the sensory system and, upon detection of a valid actuation of the operating element, outputs to the drive unit of the actuator a control signal for pulsed mechanical excitation of the actuation arm by the actuating element of the actuator.

2. Operating unit according to claim 1, wherein the actuation arm is formed as a material strip.

3. Operating unit according to claim 1, wherein the actuation arm comprises metal or plastic.

4. Operating unit according to claim 1, wherein the actuation arm within its extension portion comprises a curved portion of substantially 180 degrees, wherein the bent-back end of the extension portion is mechanically fixed on and/or in the housing.

5. Operating unit according to claim 1, wherein the extension portion comprises two partial portions which are elastically connected to each other, wherein the first partial portion extends from the force application point of the actuation arm and wherein the second partial portion is connected to the first partial portion at the end of the first partial portion opposite to the force application point of the actuation arm.

6. Operating unit according to claim 5, wherein, between the two partial portions of the extension portion, a curved portion is arranged which is integrally connected to the extension portion and by which the two partial portions are elastically connected to each other.

7. Operating unit according to claim 5 wherein the two partial portions are connected to each other by means of an elastic material which, between end portions of the two partial portions extending substantially parallel to each other, is enclosed on both sides by the two end portions.

8. Operating unit according to claim 7, wherein the elastic material comprises an elastomer.

9. Operating unit according to claim 1, wherein the actuator is operating electromechanically.

10. Operating unit according to claim 1, wherein the actuator is a piezo actuator with or without amplifying gear for enlarging the stroke of the piezo actuator, wherein the piezo actuator forms both the drive unit and the actuating element of the actuator or, if an amplifying drive is provided, the piezo actuator forms the drive unit of the actuator and the amplifying drive forms the actuating element of the actuator.

11. Operating unit according to claim 1, wherein the actuation arm comprises iron, steel, or spring steel.

12. Operating unit according to claim 7, wherein the elastic material comprises a rubber or a silicone.

13. Operating unit according to claim 1, wherein the actuator is operating electromagnetically.

* * * * *